(12) United States Patent
Ota

(10) Patent No.: US 8,049,800 B2
(45) Date of Patent: Nov. 1, 2011

(54) IMAGING DEVICE AND METHOD OF DRIVING SOLID STATE IMAGING ELEMENT

(75) Inventor: Motoari Ota, Kanagawa (JP)

(73) Assignee: Fujifilm Corporation (JP)

( * ) Notice: Subject to any disclaimer, the term of this patent is extended or adjusted under 35 U.S.C. 154(b) by 282 days.

(21) Appl. No.: 12/497,154

(22) Filed: Jul. 2, 2009

(65) Prior Publication Data

US 2010/0002113 A1  Jan. 7, 2010

(30) Foreign Application Priority Data

Jul. 3, 2008  (JP) .................................. 2008-174320

(51) Int. Cl.
*H04N 3/14* (2006.01)
*H04N 5/335* (2011.01)

(52) U.S. Cl. ......................................... 348/294; 348/297

(58) Field of Classification Search .................. 348/294, 348/297, E5.091
See application file for complete search history.

(56) References Cited

U.S. PATENT DOCUMENTS

| | | | | |
|---|---|---|---|---|
| 6,631,022 B1* | 10/2003 | Kihira et al. | .................. | 359/265 |
| 7,119,402 B2* | 10/2006 | Kinoshita et al. | ............. | 257/369 |
| 7,515,187 B2* | 4/2009 | Suzuki | .......................... | 348/296 |
| 7,652,705 B2* | 1/2010 | Suzuki | .......................... | 348/308 |
| 2004/0056180 A1* | 3/2004 | Yu | .............................. | 250/214.1 |

FOREIGN PATENT DOCUMENTS

JP  2005-268477 A  9/2005

* cited by examiner

*Primary Examiner* — Hung Lam
(74) *Attorney, Agent, or Firm* — Studebaker & Brackett PC; Donald R. Studebaker

(57) ABSTRACT

An imaging device includes a solid state imaging element that includes a plurality of pixels; and a driving unit; wherein each pixel includes: a photoelectric converting element includes a pair of electrodes stacked above a semiconductor substrate and a photoelectric converting layer arranged between the electrodes; a connecting portion that is arranged in the semiconductor substrate; a potential barrier portion; a first charge accumulating portion; and a signal output circuit, and wherein the driving unit executes such a same potential driving that the connecting portion and the potential barrier portion are set to have a same potential by varying the potential of the potential barrier portion.

18 Claims, 10 Drawing Sheets

PRIOR ART

PRIOR ART

IMAGING DEVICE AND METHOD OF DRIVING SOLID STATE IMAGING ELEMENT

The present application claims priority from Japanese Patent Application No. 2008-174320, filed on Jul. 3, 2008, the entire content of which is incorporated herein by reference.

BACKGROUND

1. Technical Field

The present invention relates to an imaging device that is equipped with a solid state imaging element containing a plurality of pixels that have a photoelectric converting element, which has a pair of electrodes stacked over a semiconductor substrate and a photoelectric converting layer put between the electrodes, respectively.

2. Description of the Related Art

In JP-A-2005-268477, the solid state imaging element equipped with a semiconductor substrate on a signal reading circuit composed of MOS transistor circuits is formed, a photoelectric converting film stacked on the semiconductor substrate to generate charges in response to a quantity of incident light, a connecting portion which is provided on a surface of the semiconductor substrate and to which a wiring for guiding the charges to the surface of the semiconductor substrate is connected, a potential barrier unit provided in vicinity of the connecting portion and acting as a predetermined potential barrier against the charges, and a charge accumulating portion provided in vicinity of the potential barrier unit and connected to a gate of an output transistor constituting the signal reading circuit is disclosed.

According to this structure, the charges generated by a photoelectric converting film can be flown smoothly to the gate of the output transistor. Therefore, an effective electrostatic capacity of a portion in which the charges are accumulated can be decreased when viewed from the gate of the output transistor, a signal voltage can be increased and thus an output signal of high sensitivity can be obtained.

FIG. 10 is a view explaining an operation of the solid state imaging element disclosed in JP-A-2005-268477, and is a view showing a sectional potential in the semiconductor substrate.

In order to acquire a signal from one pixel of the solid state imaging element, first the charges accumulated in the charge accumulating portion are discharged to the reset drain and the reset operation is executed (time T0). At this time, as shown in FIG. 10, a reset noise N1 as noise charges generated due to the reset operation is accumulated in the charge accumulating portion. After the reset is completed, the exposure of the photoelectric converting film is started, and then the charges Q generated by this exposure are accumulated in the charge accumulating portion from the connecting portion through a potential barrier (time T1). Then, a signal responding to a quantity of charge accumulated in the charge accumulating portion during this exposure period is output from the signal reading circuit. After this signal output, the reset operation is executed again at a time T2, and a reset noise N2 is accumulated in the charge accumulating portion. Then, the next exposure is started in this state.

In the signal processing circuit for processing the signal output from the solid state imaging element, the correlated double sampling (CDS) circuit for applying a correlated double sampling process to the signal is contained. In this CDS circuit, sampling of both a signal responding to the reset noise and a signal responding to the charges in which the reset noise is contained are executed, and then the reset noise is removed by calculating a difference between both signals.

The reset noise can be removed completely by subtracting the signal responding to the reset noise N1 acquired at a time T0 from the imaging signal acquired at a time T1. In order to make such process, in the CDS circuit, the signal being output from the solid state imaging element must be sampled at a time T0 (sampling SP1), then the signal being output from the solid state imaging element must be sampled at a time T1 (sampling SP2), and then a difference between both resultant signals must be calculated. In this case, a time period from the sampling SP1 to the sampling SP2 is equal to an exposure period, and the CDS circuit has to process sequentially the signals from all pixels. Therefore, if the samplings of signals are executed at such time interval, the process cannot catch up with the signals that are being output from the solid state imaging element sequentially.

For this reason, in the prior art, removal of the reset noise (a part of reset noise can be removed, although such noise cannot be perfectly removed) is executed by subtracting the signal that is sampled at a time T2 (sampling SP3) from the signal that is sampled at a time T1. Since a time interval between the sampling SP2 and the sampling SP3 is sufficiently short in contrast to the exposure period, the CDS process can be applied to the signals from all pixels without any trouble.

The charges that decide a potential of the connecting portion always flow out from the connecting portion to the charge accumulating portion due to thermal diffusion. In the meanwhile, members such as wirings, photoelectric converting film, and the like are connected to the connecting portion. Thus, the charges generated in the photoelectric converting film flow into the connecting portion via the members, and the charges generated in a joined portion between the connecting portion and the substrate flow into the connecting portion. Therefore, an outflow of the charges from the connecting portion due to the thermal diffusion stops apparently when a quantity of charges per unit time that flow out from the connecting portion due to the thermal diffusion becomes equal to a quantity of charges per unit time that flow into the connecting portion via the wiring, etc. (this moment is called an equilibrium state).

A total quantity ΔQ of charges that are diffused from the connecting portion to peripheral areas due to thermal excitation until a time t (<time teq at which the charges reach an equilibrium state) is given by following Expression (1).

$$\Delta Q \propto \ln(1+\alpha t) \quad (1)$$

Where α is a proportionality factor.

As shown at a time T0 in FIG. 9, such a situation is ideal that, as the result of this equilibrium state, the potential barrier and the connecting portion are set to the same potential. The pixels that are in the ideal equilibrium state exist, and also the pixels in which a potential of the connecting portion is higher than a potential of the potential barrier in the equilibrium state exist. FIG. 10 shows the potential of such pixel. As shown in FIG. 10, the charges that decide a potential of the connecting portion is decreased by ΔQ, and a potential of the connecting portion becomes higher than a potential of the potential barrier.

When the exposure is started in a state shown in FIG. 10, a part of the charges Q generated by the photoelectric converting film remains in the connecting portion. Therefore, a quantity of charges that move to the charge accumulating portion, i.e., a quantity of signals that are read out to the outside, is decreased by ΔQ, which causes a lag.

Further, the signal output characteristic with respect to a quantity of incident light depends on a potential of the connecting portion, i.e., a depth of a potential well of the connecting portion, a depth of the potential well depends on an amount of thermal diffusion of charges in the connecting portion, an amount of thermal diffusion depends on a quantity of current that flows into the connecting portion, a quantity of current that flows into the connecting portion depends on a quantity of current that flows into the connecting portion from the photoelectric converting film, and a depth of the potential well is varied along with the time. As a result, a signal output is not decided uniquely in response to a quantity of incident light, and thus it is impossible to execute a linearity correction simply based on the correction information that are held in advance.

SUMMARY OF INVENTION

The present invention has been made in view of the above circumstances, and it is intended to prevent a lag and also allow a linearity correction by preventing such a situation that charges remain in a connecting portion between a photoelectric converting element and a semiconductor substrate, in an imaging device that is equipped with a solid state imaging element containing the photoelectric converting element provided over the semiconductor substrate.

(1) An imaging device includes: a solid state imaging element that has a plurality of pixels including: a semiconductor substrate; a pair of electrodes stacked above the semiconductor substrate; and a photoelectric converting layer arranged between the pair of electrodes; and a driving unit that drives the solid state imaging element; wherein each of the plurality of pixels includes: a connecting portion that is arranged in the semiconductor substrate and that is connected electrically to one of the pair of electrodes; a potential barrier portion that is arranged adjacent to the connecting portion in the semiconductor substrate and that acts as a potential barrier against a potential of the connecting portion; a first charge accumulating portion that is arranged adjacent to the potential barrier portion in the semiconductor substrate and in which charges generated in the photoelectric converting layer are accumulated via the connecting portion and the potential barrier portion; and a signal output circuit that outputs a signal in response to the charges accumulated in the first charge accumulating portion, and wherein the driving unit executes such a same potential driving that the connecting portion and the potential barrier portion are set to have a same potential by varying the potential of the potential barrier portion.

According to this configuration, the exposure can be carried out in a state that the connecting portion and the potential barrier portion are set to the same potential respectively due to changing the potential of the potential barrier portion. Therefore, such a situation can be prevented that a part of the charges produced in the photoelectric converting layer during the exposure remain in the connecting portion, and occurrence of the lag can be prevented. Also, since the potential of the connecting portion (which becomes equal to the potential of the potential barrier portion) in starting the exposure can be known, a reference level of the output signal can be set. As a result, the linearity correction of the signal output characteristic with respect to a quantity of incident light can be applied, and the signal output characteristic can be set linearly.

(2) In the imaging device according to (1), the signal output circuit includes a reset transistor, and wherein the driving unit executes the same potential driving in such a manner that the driving unit controls the potential of the potential barrier portion so that the potential of the potential barrier portion becomes higher or lower than the potential of the connecting portion before the same potential driving is started, and unnecessary charges that overflow from the connecting portion by controlling the potential of the potential barrier portion are discharged to a drain of the reset transistor.

According to this configuration, the exposure can be executed in a state that the potential of the connecting portion and the potential of the potential barrier portion are set to the same potential.

(3) In the imaging device according to (2), the driving unit starts an exposure of the solid state imaging element in a state that the connecting portion and the potential barrier portion execute a same potential, and the driving unit decreases the potential of the potential barrier portion lower or increase the potential of the potential barrier portion higher as compared with a potential of the potential barrier portion during the exposure after the exposure is ended.

According to this configuration, such a situation can be prevented that the charges are flown into the first charge accumulating portion from the connecting portion during the signal reading period. Therefore, the noise can be reduced.

(4) In the imaging device according to (2), a potential deciding mode in which the potential of the potential barrier portion in the same potential driving is decided is provided, and wherein the driving unit sets such a state that the charges responding to the incident light do not flow into the connecting portion from the photoelectric converting layer in the potential deciding mode, then repeats such a driving that the signal output circuit is caused to output a signal responding to the charges, which are accumulated in the first charge accumulating portion when the potential of the potential barrier portion is set to a value "V_on" in the state, while increasing or decreasing the value "V_on" by "V_step" every time of the driving until the signal is output from the signal output circuit of all pixels, and then sets the value "V_on" being obtained at a point of time when the signal is output from the signal output circuit of all pixels as the potential of the potential barrier portion to be executed in the same potential driving.

According to this configuration, such control can be applied in driving at the same potential in all pixels that the potential of the potential barrier portion is set higher or lower than the potential of the connecting portion. Also, the connecting portion and the potential of the potential barrier portion can be set to the same potential.

(5) In the imaging device according to (4), the potential deciding mode is executed when a power supply is turned on.

According to this configuration, the potential of the connecting portion is stable at a point of time the power supply is turned on. Therefore, decision accuracy can be improved by deciding the potential at a time when the power supply is turned on.

(6) In the imaging device according to (4), the potential deciding mode is executed every constant time after a power supply is turned on.

According to this configuration, the potential of the connecting portion is varied depending upon a used time of the imaging device. Therefore, generation of the residual charges in the connecting portion can be always prevented by deciding the potential every predetermined time period.

(7) In the imaging device according to (1), each pixel further includes a second charge accumulating portion that is arranged in the semiconductor substrate and that is connected to a gate of an output transistor constituting the signal output circuit, and a charge transferring unit that transfers the charges accumulated in the first charge accumulating portion to the second charge accumulating portion.

(8) In the imaging device according to (7), the first charge accumulating portion is formed of an embedded type accumulating portion.

(9) In the imaging device according to (1), the photoelectric converting layer is formed of organic material.

(10) A method of driving a solid state imaging element that has a plurality of pixels including: a semiconductor substrate; a pair of electrodes stacked above the semiconductor substrate; a photoelectric converting layer arranged between the pair of electrodes; a connecting portion that is arranged in the semiconductor substrate and that is connected electrically to one of the pair of electrodes; a potential barrier portion that is arranged adjacent to the connecting portion in the semiconductor substrate and that acts as a potential barrier against a potential of the connecting portion; a first charge accumulating portion that is arranged adjacent to the potential barrier portion in the semiconductor substrate and in which charges generated in the photoelectric converting layer are accumulated via the connecting portion and the potential barrier portion; and a signal output circuit that outputs a signal in response to the charges accumulated in the first charge accumulating portion, the method includes a same potential driving that includes variably controlling the potential of the potential barrier portion so that the connecting portion and the potential barrier portion are set to a same potential.

(11) In the method of driving the solid state imaging element according to (10), the same potential driving is performed so that the potential of the potential barrier portion becomes higher or lower than the potential of the connecting portion before the same potential driving is started, and the method further includes: discharging unnecessary charges that overflow from the connecting portion by controlling the potential of the potential barrier portion to a drain of the reset transistor in the signal output circuit.

(12) The method of driving the solid state imaging element according to (11) further includes: starting an exposure of the solid state imaging element in a state that the connecting portion and the potential barrier portion are set to a same potential, and decreasing the potential of the potential barrier portion lower or increasing the potential of the potential barrier portion higher than a potential during the exposure after the exposure is ended.

(13) In the method of driving the solid state imaging element according to (11), when the potential of the potential barrier portion in the same potential driving is decided, the driving of the solid state imaging element includes: setting such a state that the charges responding to the incident light do not flow into the connecting portion from the photoelectric converting layer in the potential deciding mode; repeating such the driving that the signal output circuit is caused to output a signal responding to the charges, which are accumulated in the first charge accumulating portion when the potential of the potential barrier portion is set to a value "V_on" in the state, while increasing or decreasing the value "V_on" by "V_step" every time of the driving until the signal is output from the signal output circuit of all pixels; and setting the value "V_on" being obtained at a point of time when the signal is output from the signal output circuit of all pixels as the potential of the potential barrier portion to be executed in the same potential driving.

(14) In the method of driving the solid state imaging element according to (13), the potential of the potential barrier portion is decided when a power supply of an imaging device equipped with the solid state imaging element is turned on.

(15) In the method of driving the solid state imaging element according to (13), the potential of the potential barrier portion is decided in every constant time after a power supply is turned on.

(16) In the method of driving the solid state imaging element according to (10), each pixel further includes a second charge accumulating portion that is arranged in the semiconductor substrate and that is connected to a gate of an output transistor constituting the signal output circuit, and a charge transferring unit that transfers the charges accumulated in the first charge accumulating portion to the second charge accumulating portion.

(17) In the method of driving the solid state imaging element according to (16), the first charge accumulating portion is formed of an embedded type accumulating portion.

(18) In the method of driving the solid state imaging element according (10), the photoelectric converting layer is formed of organic material.

According to the present invention, it is possible to prevent the lag and also allow the linearity correction by preventing such a situation that the charges remain in the connecting portion between the photoelectric converting element and the semiconductor substrate, in an imaging device that is equipped with the solid state imaging element containing the photoelectric converting element provided over the semiconductor substrate.

DETAILED DESCRIPTION

Embodiments of the present invention will be explained with reference to the drawings hereinafter.

First Embodiment

Figure 1:
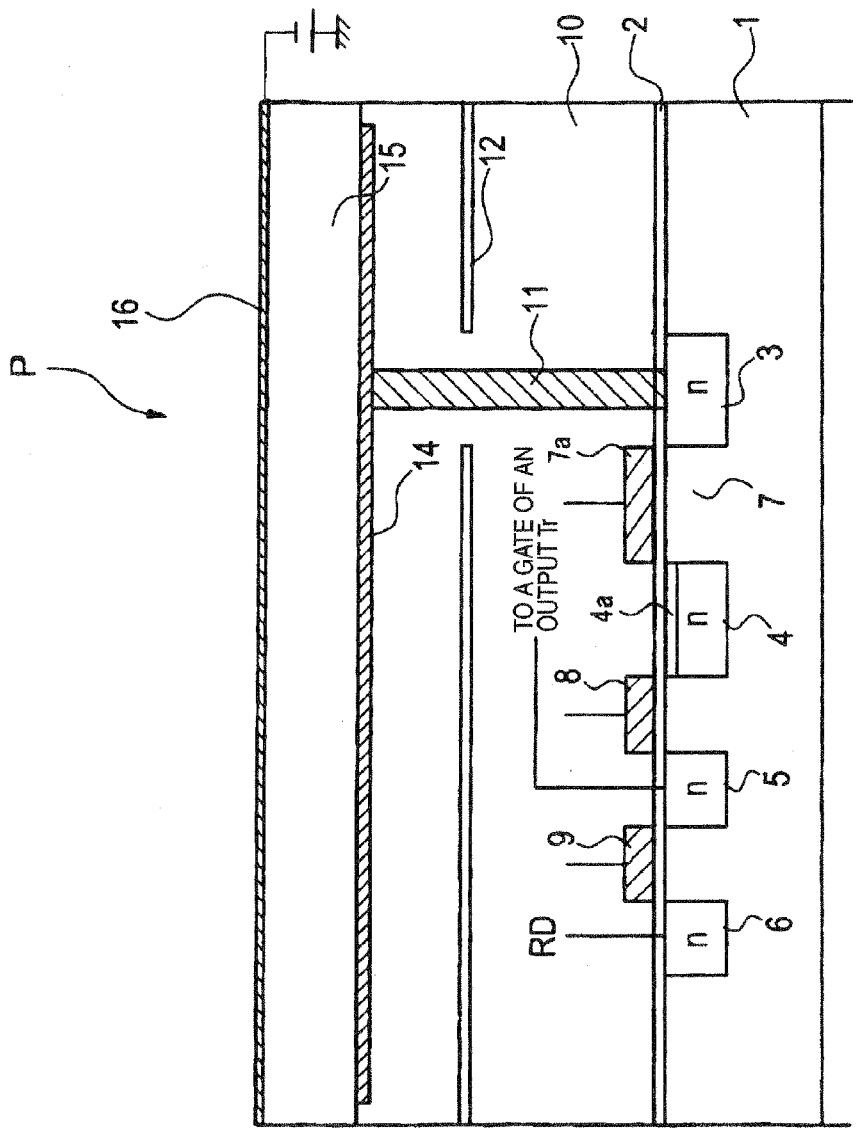
FIG. 1 is a schematic sectional view showing one pixel of a solid state imaging element as a first embodiment of the present invention.

FIG. 1 is a schematic sectional view showing one pixel of a solid state imaging element as a first embodiment of the present invention. The solid state imaging element is constructed by arranging one pixel shown in FIG. 1 in plural on the same plane one-dimensionally or two-dimensionally. While taking as an example such a configuration that one pixel shown in FIG. 1 is aligned two-dimensionally in the row (horizontal) direction and the column (vertical) direction perpendicular to the row (horizontal) direction, explanation will be made hereunder.

The solid state imaging element shown in FIG. 1 contains a p-type silicon substrate 1 as a semiconductor substrate (referred to as a "substrate 1" hereinafter), and a photoelectric converting element P stacked over the substrate 1 via a gate insulating film 2 and an insulating layer 10.

The photoelectric converting element P is constructed to includes a lower electrode 14 formed on the insulating layer 10, a photoelectric converting layer 15 formed on the lower electrode 14, and an upper electrode 16 formed on the photoelectric converting layer 15.

An incident light from a subject located on the upper side is incident onto the upper electrode 16. Since the upper electrode 16 inputs the incident light into the photoelectric converting layer 15, such upper electrode 16 is formed of a conductive material such as ITO, which is transparent to the incident light. A sheet of the upper electrode 16 is used commonly to all pixels, but the upper electrode 16 may be divided every pixel.

The lower electrode 14 is formed of a thin film that is divided every pixel, and is formed of a transparent or opaque conductive material (ITO, aluminum, or the like).

The photoelectric converting layer 15 is formed of an organic or inorganic photoelectric converting material that absorbs a light in a particular wavelength range out of the incident light, and produces the charges in response to a quantity of absorbed light. When the photoelectric converting layer 15 is formed of the photoelectric converting material (e.g., quinacridone) that absorbs a light in an infrared wavelength range out of the incident light and produces the charges in response to this light, the monochromatic image under the visible rays can be picked up. When the photoelectric converting layer 15 is formed of the photoelectric converting material (e.g., phthalocyanine-based organic material or naththalocyanine-based organic material) that absorbs a light in an infrared wavelength range and produces the charges in response to this light, the monochromatic image under the infrared rays can be picked up.

A connecting portion 3 formed of an n-type impurity layer and connected electrically to the lower electrode 14 is provided in the substrate 1. The connecting portion 3 and the lower electrode 14 are connected by a contact wiring 11 that is formed of the conductive material and embedded in the gate insulating film 2 and the insulating layer 10.

A p-type potential barrier portion 7 of opposite conductive type to the connecting portion 3 is provided adjacent to the connecting portion 3. The potential barrier portion 7 functions as a potential barrier unit that acts as the potential barrier against the connecting portion 3.

A first charge accumulating portion 4 for accumulating the charges, which reach the connecting portion 3 from the contact wiring 11 and move through the potential barrier portion 7, is provided adjacent to the potential barrier portion 7. The first charge accumulating portion 4 is formed of an n-type impurity layer that is the same conductivity type as the connecting portion 3.

A p-type impurity layer 4a, formed by implanting a p-type impurity of opposite conductivity type to the first charge accumulating portion 4 is formed on a surface of the first charge accumulating portion 4. Because the p-type impurity layer 4a, is formed on the surface of the first charge accumulating portion 4, the first charge accumulating portion 4 is formed not on the outermost surface of the substrate but in the substrate as a "so-called embedded type", so that the charges are accumulated in the substrate. As a result, mixture of a dark current generated on the surface of the substrate can be suppressed, and also a S/N ratio can be improved. Also, when the first charge accumulating portion 4 is formed as the perfect depletion layer by adjusting an impurity concentration of the first charge accumulating portion 4 and the p-type impurity layer 4a, the so-called perfect transfer can be achieved.

A gate electrode 7a, of a transistor, which has the connecting portion 3 as a source and the first charge accumulating portion 4 as a drain, is provided over the potential barrier portion 7 via the gate insulating film 2. The gate electrode 7a, variably controls the potential of the potential barrier portion. The gate electrode 7a, is referred to as a barrier gate 7a hereinafter.

A second charge accumulating portion 5 is provided adjacent to the first charge accumulating portion 4 at a short distance from there. The second charge accumulating portion 5 is formed of an n-type impurity layer of the same conductivity type as the connecting portion 3.

A gate electrode 8 of a transistor, which has the first charge accumulating portion 4 as a source and the second charge accumulating portion 5 as a drain, is provided over the substrate between the first charge accumulating portion 4 and the second charge accumulating portion 5 via the gate insulating film 2. The gate electrode 8 functions as a potential transferring unit that transfers the charges accumulated in the first charge accumulating portion 4 to the second charge accumulating portion 5. The gate electrode 8 is referred to as a transfer gate 8. When a high-voltage charge transfer pulse is applied to the gate electrode 8, the charges accumulated in the first charge accumulating portion 4 are transferred to the second charge accumulating portion 5. It is preferable that the first charge accumulating portion 4 should be formed as the perfect depletion layer. By doing this, the charges accumulated in the first charge accumulating portion 4 are transferred perfectly to the second charge accumulating portion 5.

A reset drain 6 formed of an n-type impurity layer of the same conductivity type as the connecting portion 3 is provided adjacent to the second charge accumulating portion 5 at a short distance from there. A gate electrode (referred to as a "reset gate" hereinafter) 9 of a transistor, which has the second charge accumulating portion 5 as a source and the reset drain 6 as a drain, is provided over the substrate 1 between the second charge accumulating portion 5 and the reset drain 6 via the gate insulating film 2. When a high-voltage reset pulse is applied to the gate electrode 9, the charges accumulated in the second charge accumulating portion 5 are discharged to the reset drain 6.

Further, the publicly known signal output circuit formed of a MOS transistor that outputs a signal in response to the charges accumulated in the second charge accumulating portion 5 is provided on the substrate 1 every pixel. The above reset transistor is contained in this signal output circuit.

Figure 2:
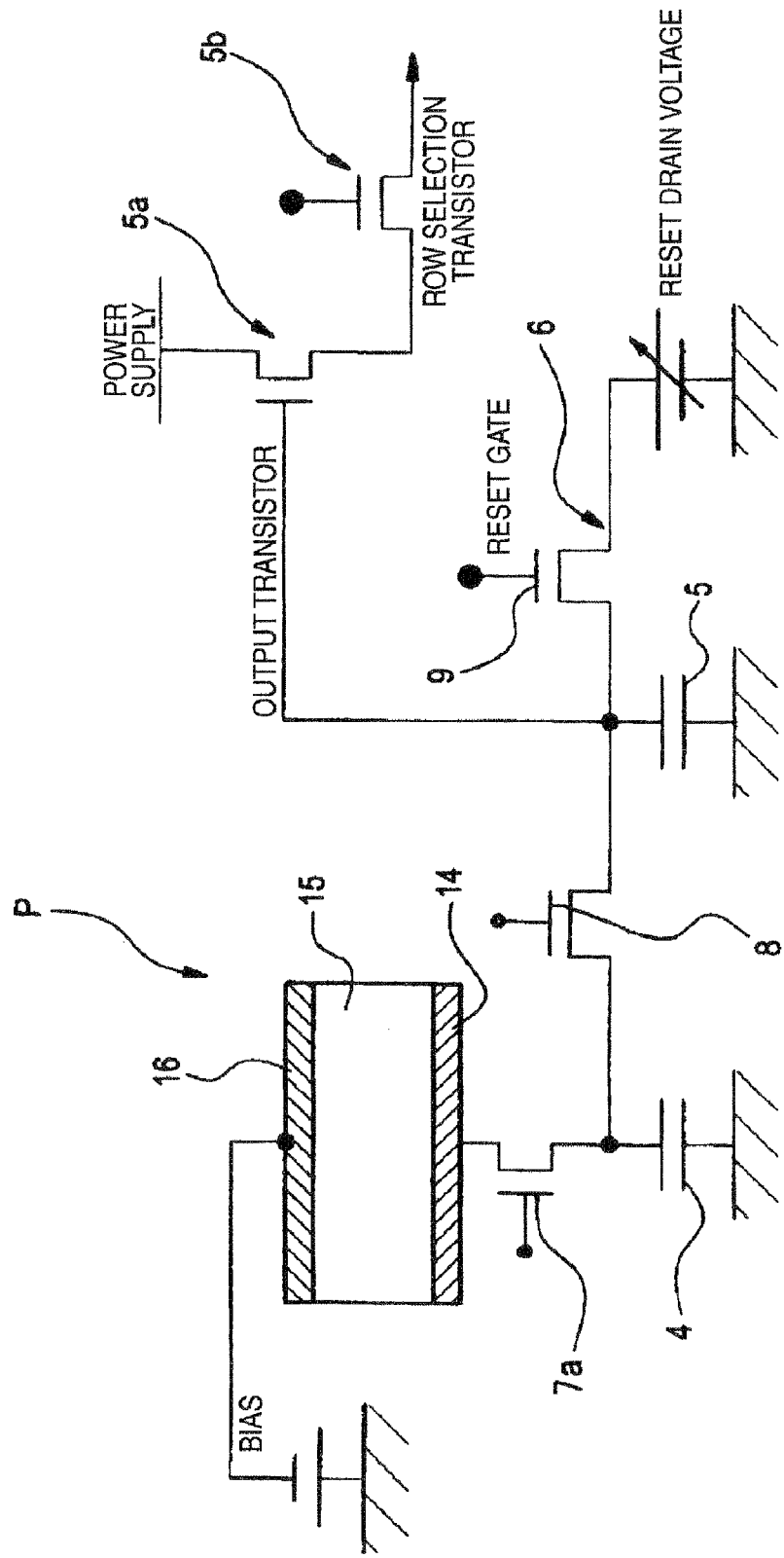
FIG. 2 is a view showing an equivalent circuit of one pixel shown in FIG. 1.

FIG. 2 is a view showing an equivalent circuit of one pixel shown in FIG. 1.

As shown in FIG. 2, the signal output circuit has an output transistor 5a and a row selection transistor 5b, in addition to the reset transistor. A gate of the output transistor 5a is connected to the second charge accumulating portion 5, a drain thereof is connected to a power supply, and a source thereof is connected to a drain of the row selection transistor 5b. The output transistor 5a outputs a voltage signal in response to a quantity of charges accumulated in the second charge accumulating portion 5.

When a row selecting pulse is applied to a gate of the row selection transistor 5b, the row selection transistor 5b outputs the voltage signal being output from the output transistor 5a to a signal line. The signal is output from all pixels respectively by applying the row selecting pulse sequentially to the signal output circuit provided to each pixel every row.

Figure 3:
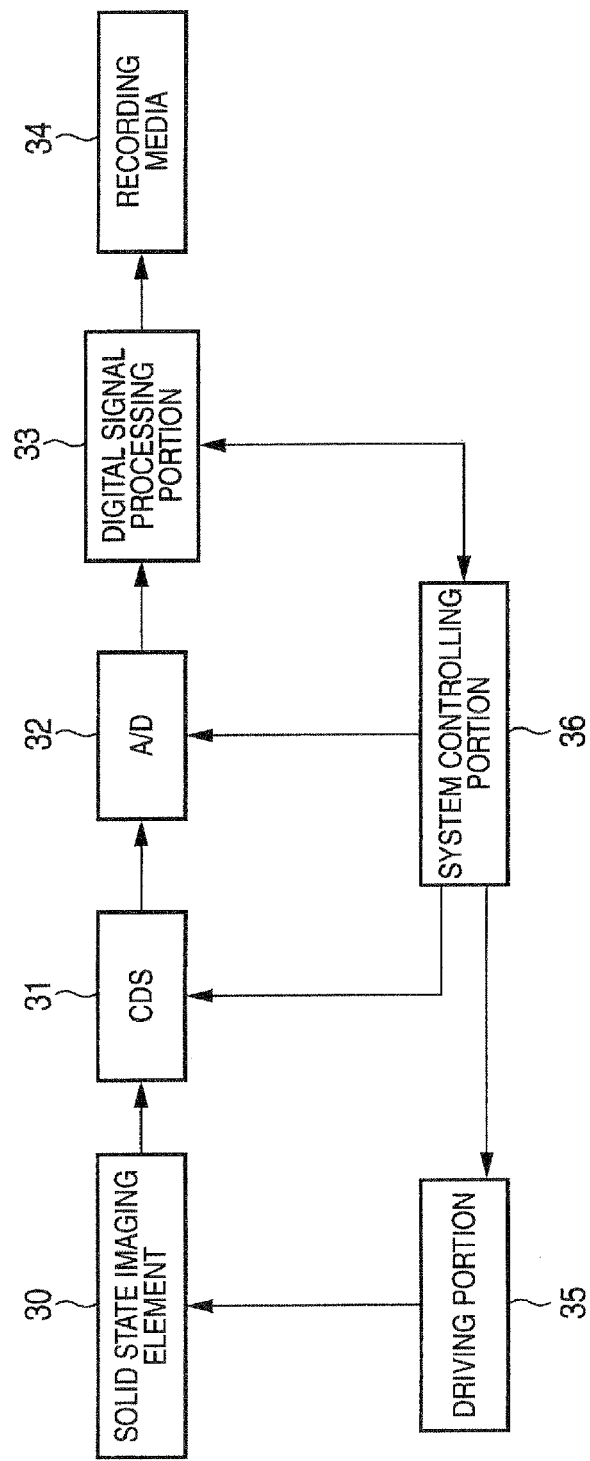
FIG. 3 is a view showing a configurative example of an imaging device into which the solid state imaging element in the first embodiment is installed.

FIG. 3 is a view showing a configurative example of an imaging device into which the solid state imaging element in the first embodiment is installed.

The imaging device shown in FIG. 3 is equipped with a solid state imaging element 30 in which the pixels shown in FIG. 1 are arranged in an array fashion, a CDS circuit 31 for removing the reset noise by applying a correlated double sampling (CDS) process to the signal acquired from each pixel of the solid state imaging element 30, an A/D converter 32 for converting an output signal of the CDS circuit 31 into a digital signal, a digital signal processing portion 33 for producing image data by applying a predetermined digital signal process to the digital signal being output from the A/D converter 32, a recording media 34 for recording the image data produced by the digital signal processing portion 33, a driving unit 35 for driving the solid state imaging element 30, and a system controlling portion 36 for unifying/controlling the overall imaging device. In this case, the solid state imaging element 30, the CDS circuit 31, and the A/D converter 32 may be incorporated into one chip (one IC).

The driving unit 35 performs control of a voltage application to the gate electrode 7a, control of a reset pulse application to the reset gate 9, control of a charge transfer pulse application to the transfer gate 8, control of a row selection pulse application the row selection transistor 5b, and the like.

An operation of the imaging device constructed in this manner in the shooting mode such as shooting for acquiring a through image, shooting for a moving picture, shooting for executing AE/AF, or the like will be explained hereunder. In this case, explanation will be made on the assumption that the electron is selected as the handling charge. For this purpose, a potential diagram used in the explanation hereunder is illustrated on the assumption that the potential is increased from the top toward the bottom in the diagram.

Figure 4:
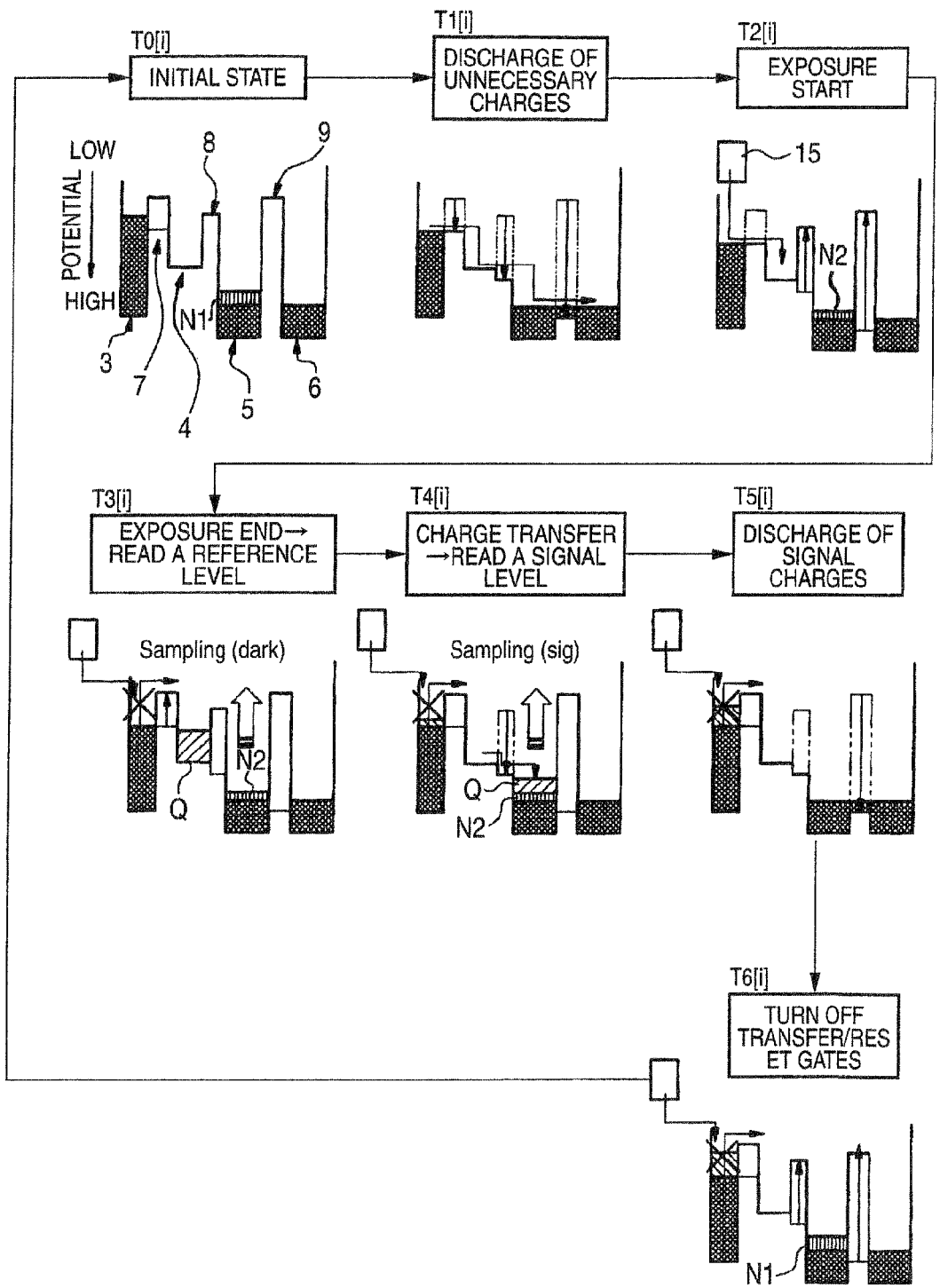
FIG. 4 is a view showing an operation of the imaging device, into which the solid state imaging element in the first embodiment is installed, in a shooting mode.

FIG. 4 is a view showing an operation in the shooting mode in respective pixels in a line (i-th line) that consists of the pixels aligned in the row direction of the solid state imaging element in the first embodiment. FIG. 4 shows a sectional potential in the substrate 1 at respective times.

After the output of the signal responding to the charges, which are generated in the photoelectric converting layer 15 in the exposure period at the preceding frame in respective pixels in the i-th line, is completed, the potential in the substrate 1 of respective pixels in the i-th line is in an initial state as shown at a time T0[i].

The initial state is defined as such a state that the first voltage is applied to the barrier gate 7a of respective pixels in the i-th line such that the potential of the potential barrier portion 7 of respective pixels in the i-th line is set to the first potential that is sufficiently lower than an exposure potential being set in the exposure period (a potential that is higher than the potential of the connecting portion 3 in the initial state, this value is decided previously in a potential deciding mode described later), the charge transfer pulse is not applied to the transfer gate 8 of respective pixels in the i-th line and the reset pulse is not applied to the reset gate 9 of respective pixels in the i-th line. In the initial state, the reset noise N1 generated by the reset operation executed immediately before the initial state is accumulated in the second charge accumulating portion 5.

From the initial state, the driving unit 35 applies the second voltage (>first voltage) to the barrier gate 7a of respective pixels in the i-th line such that the potential of the potential barrier portion 7 becomes the exposure potential, applies the charge transfer pulse to the transfer gate 8 of respective pixels in the i-th line, and applies the reset pulse to the reset gate 9 of respective pixels in the i-th line. Accordingly, the connecting portion 3 and the potential barrier portion 7 are set to the same potential, and the unnecessary charges existing in the connecting portion 3 and the reset noise N1 are discharged to the reset drain 6 (time T1[i]).

Then, the driving unit 35 stops the application of the charge transfer pulse to the transfer gate 8 of respective pixels in the i-th line and the application of the reset pulse to the reset gate 9 of respective pixels in the i-th line. According to this, the exposure period (period in which the exposure is made to produce the image such as the through image, or the like) is started, the charges G generated by the photoelectric converting layer 15 reach the connecting portion 3, and the charges G are accumulated in the first charge accumulating portion 4 via the potential barrier portion 7 (time T2[i]). At this time, only the reset noise N2 generated by the preceding reset operation is accumulated in the second charge accumulating portion 5.

When the set exposure period reaches an end time, the driving unit 35 restores the potential of the potential barrier portion 7 to the value in the initial state by applying the first voltage to the barrier gate 7a of respective pixels in the i-th line. At this time, a large potential difference (equal to a difference between the exposure potential and the first potential) is caused between the connecting portion 3 and the potential barrier portion 7. Therefore, an inflow of the charges into the first charge accumulating portion 4 from the connecting portion 3 due to thermal diffusion is reduced to a negligibly small amount. In this case, a difference between the exposure potential and the first potential may be set to such a value that a quantity of current that flows into the first charge accumulating portion 4 from the connecting portion 3 can be regarded negligibly small.

The driving unit 35 restores the potential of the potential barrier portion 7 to the value in the initial state, and then causes the signal output circuit to output the reset noise signal (dark) that responds to the reset noise N2 existing in the second charge accumulating portion 5 of respective pixels in the i-th line (time T3[i]). This reset noise signal (dark) is sampled by the CDS circuit 31.

Then, the driving unit 35 applies the charge transfer pulse to the transfer gate 8 of respective pixels in the i-th line, and thus transfers the charges Q accumulated in the first charge accumulating portion 4 of respective pixels in the i-th line to the second charge accumulating portion 5 (time T4[i]).

After the transfer of the charges Q is completed, the driving unit 35 causes the signal output circuit to output an imaging signal (sig) responding to the charges (Q+N2) that exist in the second charge accumulating portion 5 of respective pixels in the i-th line. The imaging signal (sig) is sampled by the CDS circuit 31, and only the signal responding to the reset noise N2 is removed by executing the (sig)−(dark) process.

Then, the driving unit 35 applies the reset pulse to the reset gate 9 of respective pixels in the i-th line. Accordingly, the charges (Q+N2) that exist in the second charge accumulating portion 5 of respective pixels in the i-th line are discharged to the reset drain 6 (time T5[i]). Then, the driving unit 35 stops the application of the charge transfer pulse to the transfer gate 8 of respective pixels in the i-th line and the application of the reset pulse to the reset gate 9 of respective pixels in the i-th line (time T6[i]). Then, the imaging device goes back to the initial state.

The driving unit 35 executes the drives from T0[i] to T6[i] while shifting the timing every line whose value of i is different.

In this case, after the imaging signal (sig) is output at a time T4[i], the imaging device may be set to a state at a time T6[i] by stopping the application of the charge transfer pulse to the transfer gate 8.

As described above, according to the imaging device of the present embodiment, the voltage applied to the barrier gate 7a is variably controlled, and thus the exposure can be carried out in a state that the connecting portion 3 and the potential barrier portion 7 are set to the same potential respectively. Therefore, such a situation can be prevented that a part of the charges produced in the photoelectric converting layer 15 during the exposure remain in the connecting portion 3, and occurrence of the lag can be prevented. Also, since the potential of the connecting portion 3 (which becomes equal to the potential of the potential barrier portion 7) in starting the exposure can be known, a reference level of the output signal can be set. As a result, the linearity correction of the signal output characteristic with respect to a quantity of incident light can be applied, and the signal output characteristic can be set linearly.

Here, when the exposure is performed in a state that there exists a potential difference between the connecting portion 3 and the potential barrier portion 7, it is unfeasible to decide how much charge is input from the photoelectric converting layer 15. As a result, a linearity of the signal output characteristic with respect to a quantity of incident light cannot be maintained. Also, in the initial state shown in FIG. 4, the potential of the connecting portion 3 is varied at any time depending upon a quantity of charges Q that pass through the connecting portion 3 until now, a quantity of charges generated by a dark current, a time, and the like. As a result, the signal output characteristic to a quantity of incident light loses the regularity, and the linearity correction cannot be applied. An addition, this potential varies pixel by pixel.

On the contrary, when the present driving method is employed, the exposure can be performed in a state that the connecting portion 3 and the potential barrier portion 7 become equal to the same potential. Therefore, it is possible to set a reference level of the signal. As a result, the signal output characteristic with respect to a quantity of incident light cannot be held linearly, nevertheless the regularity can be provided to the signal output characteristic with respect to a quantity of incident light, and the linearity can be corrected systematically.

Figure 5:
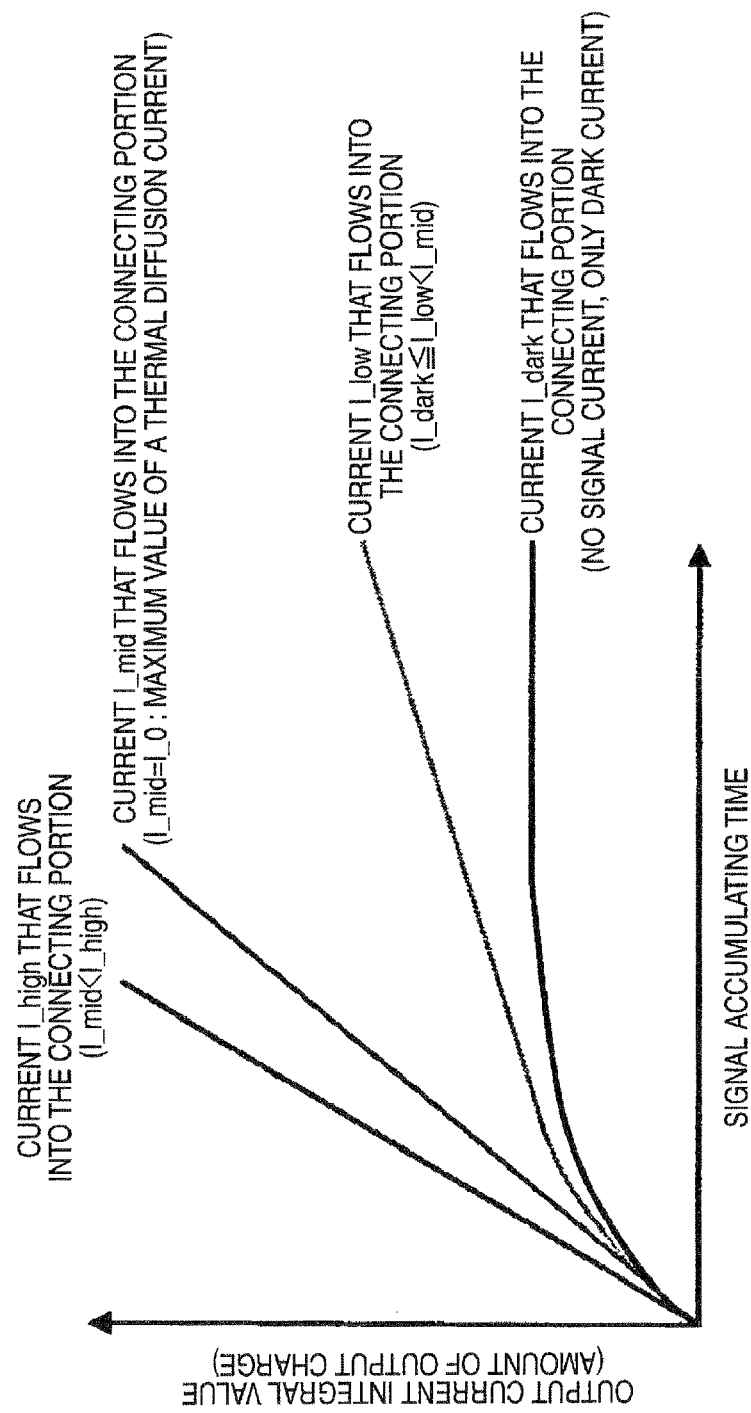
FIG. 5 is a conceptual view showing a signal output characteristic with regard to a signal accumulation time when a driving system in the first embodiment is employed.

FIG. 5 is a conceptual view showing the signal output characteristic with regard to a signal accumulation time when the driving system in the first embodiment is employed.

If the present characteristic is recorded in advance in the imaging system, the linearity correction can be made systematically, and the signal output characteristic with respect to a quantity of incident light can be set linearly. A quantity of current emitted due to a thermal excitation is decreased exponentially with time (see Expression (1)). Then, when a quantity of emitted current and a quantity of current flowing into the connecting portion 3 are balanced (dark current+signal current responding to the subject), a thermal equilibrium state is attained and a quantity of current emitted due to a thermal excitation becomes zero apparently. Therefore, the output characteristic with respect to the input signal becomes a function of a signal accumulation time like FIG. 5. In this manner, when the signal accumulation time (exposure time) and a quantity of output charges are known, a quantity of signal current can be known from a graph shown in FIG. 5 and as a result the linearity correction can be attained.

Also, according to the imaging device of the present embodiment, the first charge accumulating portion 4 for storing temporarily the charges generated in the exposure period is provided. Therefore, the sampling of the reset noise signal (dark) and the sampling of the imaging signal (sig) can be executed in a minute time interval, which is shorter than the exposure period of the solid state imaging element, between a time T3[i] and a time T4[i] in FIG. 4. Also, the noise signal due to the reset noise contained in the imaging signal can be removed precisely.

Also, according to the solid state imaging element of the present embodiment, the photoelectric converting element P is provided not in the substrate 1 but over the substrate 1. Therefore, a space that is enough to add the first charge accumulating portion 4 can be ensured in the substrate 1. In the case of the common solid state imaging element in which the photodiode is formed in the substrate 1, when the first charge accumulating portion 4 is added in the substrate, it is difficult to keep a space for the photodiode and a reduction in sensitivity is feared. Also, it is feared that, in order to keep a sensitivity, a reduction in the number of pixels, an increase of chip size, or the like is caused. According to the solid state imaging element of the present embodiment, such fear is never caused.

In order to achieve the above-mentioned effect, the exposure potential must be decided in advance such that the connecting portion 3 and the potential barrier portion 7 can be set to the same potential. Next, a method of deciding this exposure potential will be explained hereunder.

The imaging device of the present embodiment has a potential deciding mode to decide the exposure potential, and this potential deciding mode is executed at a predetermined timing.

Figure 6:
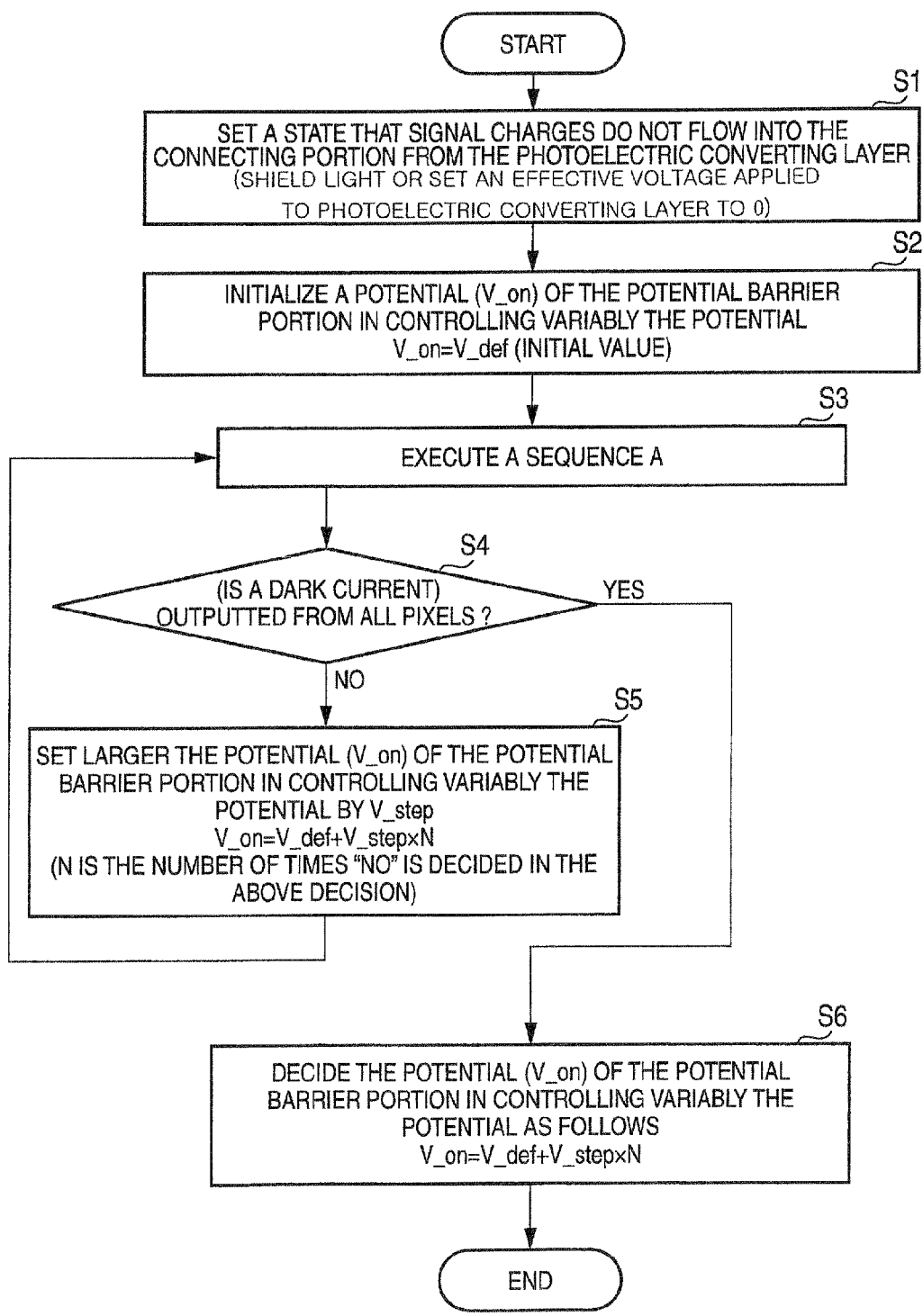
FIG. 6 is a flowchart explaining an operation in a potential deciding mode of the imaging device in the first embodiment.

FIG. 6 is a flowchart explaining an operation in the potential deciding mode of the imaging device in the first embodiment.

When the potential deciding mode is started, the driving unit 35 sets such a state that the charges responding to an incident light (i.e., the charges except the dark current charges generated in a state that there is no light) do not flow into the connecting portion 3 from the photoelectric converting layer 15 (step S1). As a method of realizing such state, there is a method of closing a mechanical shutter in the case where the mechanical shutter for shielding a light to the solid state imaging element 30 is incorporated into the imaging device. Also, there is a method of controlling a bias voltage applied to the upper electrode 16 such that an effective voltage applied to the photoelectric converting layer 15 becomes 0.

Then, the system controlling portion 36 sets the exposure potential (V_on) of the potential barrier portion 7, which is to be set at a time T1[i] shown in FIG. 4, to (V_def) as an initial value(step S2), and then causes the driving unit 35 to execute a sequence A (step S3).

Figure 7:
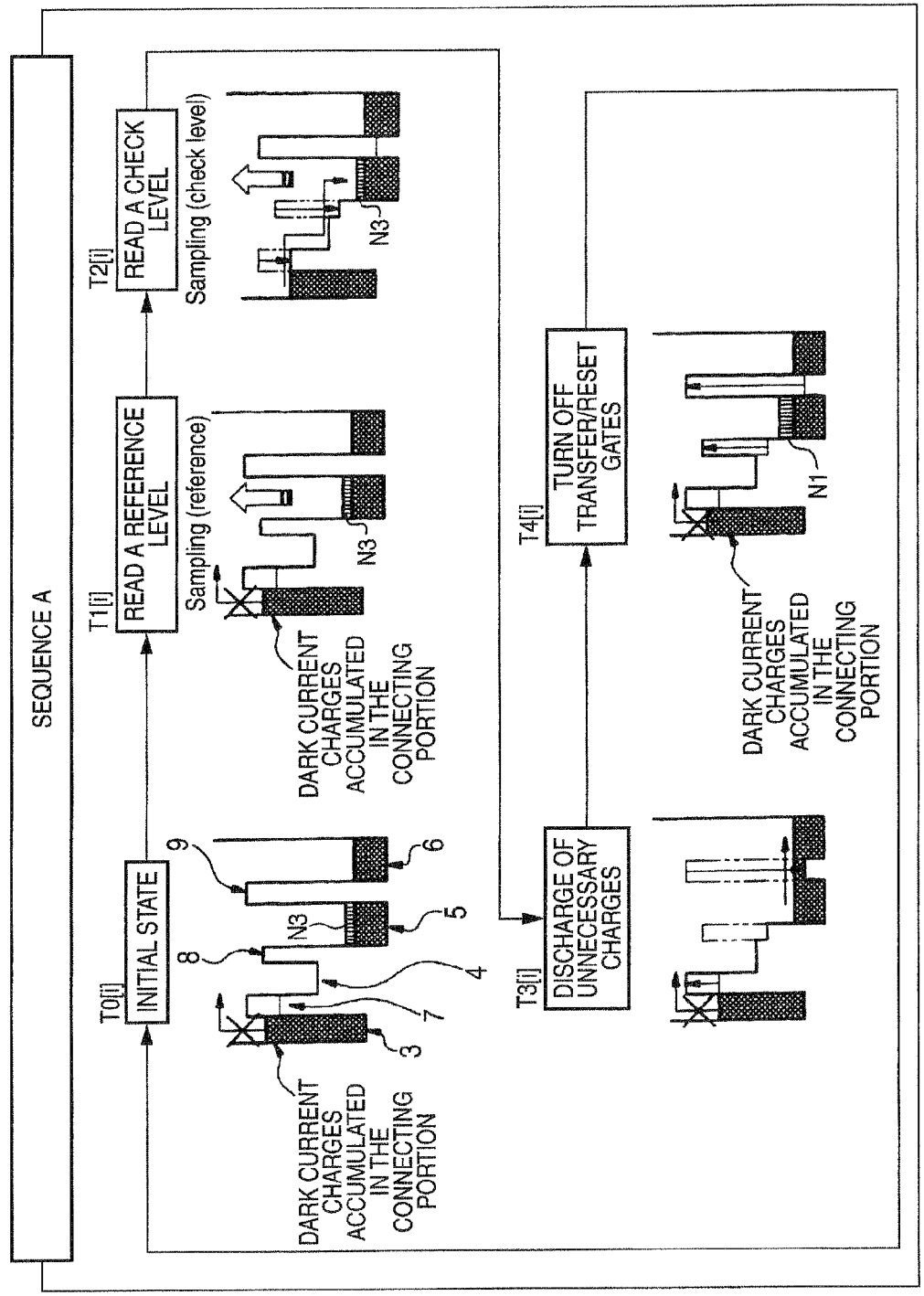
FIG. 7 is a view showing an operation of the imaging device at a time of executing a sequence A a shown in FIG. 6.

FIG. 7 is a view showing an operation of the imaging device at a time of executing the sequence A shown in FIG. 6. FIG. 7 shows a sectional potential in the substrate 1 at respective times.

In an example shown in FIG. 7, the pixels in all lines are set to the initial state at a time T0[i]. This initial state is similar to the state at a time T0[i] in FIG. 4. In the example in FIG. 7, the reset noise N3 is accumulated in the second charge accumulating portion 5. From the initial state, the driving unit 35 causes the signal output circuit to output the reset noise signal (reference level) responding to the reset noise N3 of respective pixels in the i(=1)-th line (time T1[i]). This reference level is sampled by the CDS circuit 31.

Then, the driving unit 35 applies the voltage to the barrier gate 7a of respective pixels in the i(=1)-th line such that the potential of the potential barrier portion 7 of respective pixels in the i(=1)-th line becomes (V_def), applies the charge transfer pulse to the transfer gate 8 of respective pixels in the i(=1)-th line, and causes the signal output circuit to output the signal (check level) responding to the charges, which are accumulated in the second charge accumulating portion 5 of respective pixels in the i(=1)-th line, in this state (time T2[i]). This check level is sampled by the CDS circuit 31, the (check level)-(reference level) process is executed, and the processed signal is input into the system controlling portion 36.

Then, the driving unit 35 applies the reset pulse to the reset gate 9 of respective pixels in the i(=1)-th line. Accordingly, the charges existing in the second charge accumulating portion 5 of respective pixels in the i(=1)-th line are discharged to the reset drain 6 (time T3[i]). Then, the driving unit 35 stops the application of the charge transfer pulse to the transfer gate 8 of respective pixels in the i(=1)-th line and the application of the reset pulse to the reset gate 9 of respective pixels in the i(=1)-th line (time T4[i]).

The driving unit 35 executes the drive from T1[i] to T4[i], as described above, sequentially every line while increasing the value of I one by one, and then returns the process to the initial state.

When the potential of the connecting portion 3 is lower than (V-def) in the initial state, the unnecessary charges move from the connecting portion 3 to the second charge accumulating portion 5 at a time T2[i]. Therefore, the signal responding to the unnecessary charges is output as a dark current from the CDS circuit 31. In contrast, When the potential of the connecting portion 3 is higher than (V-def) in the initial state, the unnecessary charges do not move from the connecting portion 3 to the second charge accumulating portion 5 at a time T2[i]. Therefore, the dark current is not output from the CDS circuit 31.

Returning to FIG. 6, the system controlling portion 36 decides whether or not the dark current is outputted from all pixels after the execution of the sequence A (step S4). If there exists the pixel from which the dark current is not output (step S4: NO), the system controlling portion 36 resets the potential (V_on) of the potential barrier portion 7 to the value that is increased from the initial value by (V_step), based on following Expression (2) (step S5), and then returns the process to step S3.

$$(V\_on)=(V\_def)+(V\_step)\times N \quad (2)$$

where N is the number of times the decision "NO" is made in the above decision.

When the dark current is outputted from all pixels (step S4: YES), the system controlling portion 36 decides the potential (V_on) of the potential barrier portion 7, which is set at present, as the exposure potential being set in the shooting mode (step S6). The driving unit 35 controls the voltage applied to the barrier gate 7a in the shooting mode to coincide with either of the exposure potential decided in step S6 and the predetermined first potential.

When the exposure potential is decided by such method, the connecting portion 3 and the potential barrier portion 7 can be set to the same potential in all pixels at a time T1[i] in FIG. 4.

Here, it is preferable that either the potential deciding mode should be executed when the adjusting step is applied in the manufacturing site of the imaging device, or the user turns ON the power supply, or the potential deciding mode should be executed every predetermined period after the power supply is turned ON.

Second Embodiment

In the first embodiment, the reset noise can be eliminated exactly by accumulating temporarily the charges generated in the exposure period in the first charge accumulating portion 4. However, when an accuracy in eliminating the reset noise is not requested, the driving system in the first embodiment can be employed even in the configuration in which the first charge accumulating portion 4 is not provided.

The solid state imaging element that is installed into the imaging device of the second embodiment may be constructed by replacing the transfer gate 8 with the reset gate 9, replacing the second charge accumulating portion 5 with the reset drain 6, and connecting the gate of the output transistor to the first charge accumulating portion 4, in the solid state imaging elements shown in FIG. 1. Here, in the case of such configuration, the p-type impurity layer 4a formed on the surface of the first charge accumulating portion 4 should be deleted.

An operation of the imaging device, into which the solid state image element constructed in this manner is installed, in a shooting mode will be explained hereunder.

Figure 8:
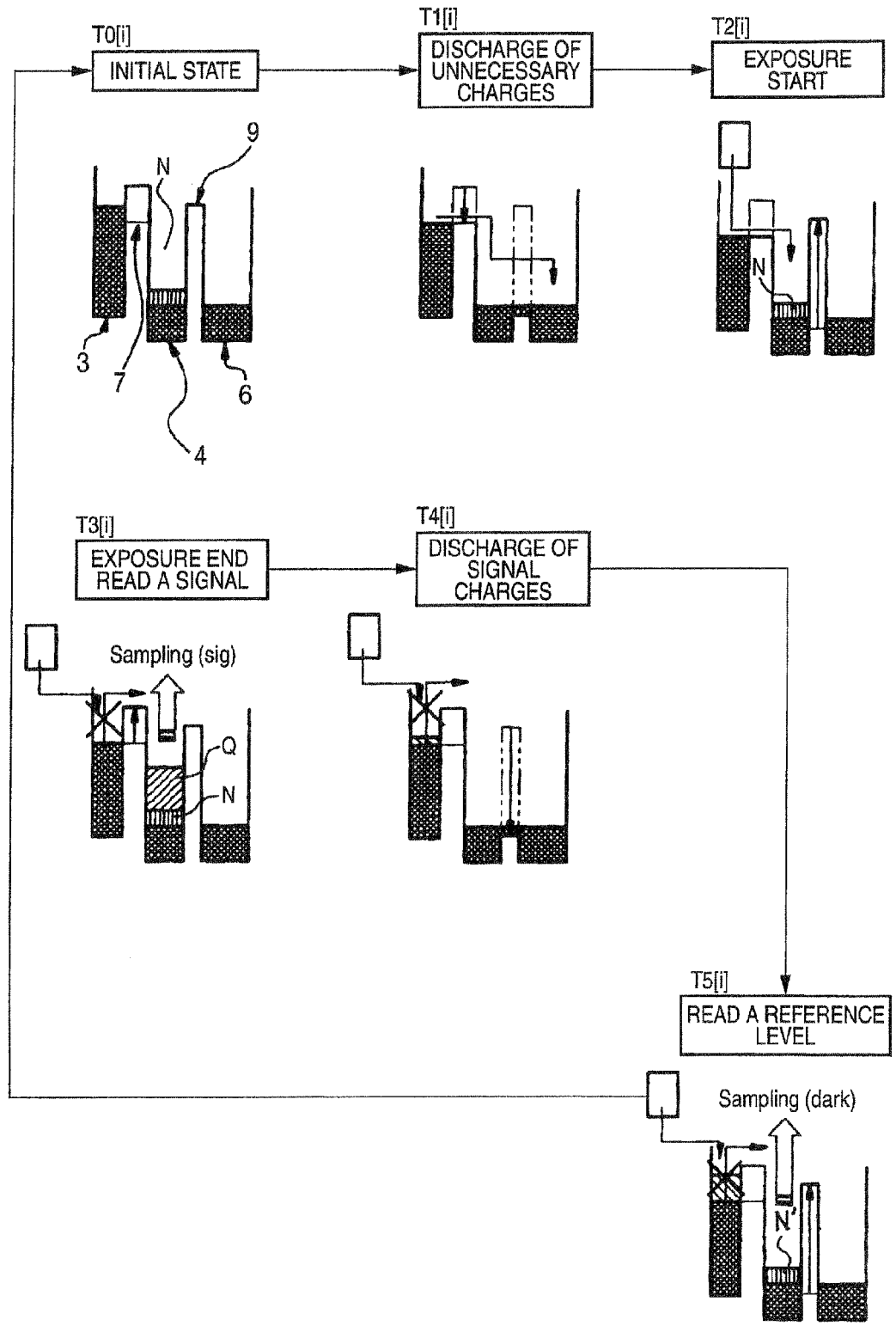
FIG. 8 is a view showing an operation of an imaging device, into which a solid state imaging element in a second embodiment is installed, in a shooting mode.
Figure 9:
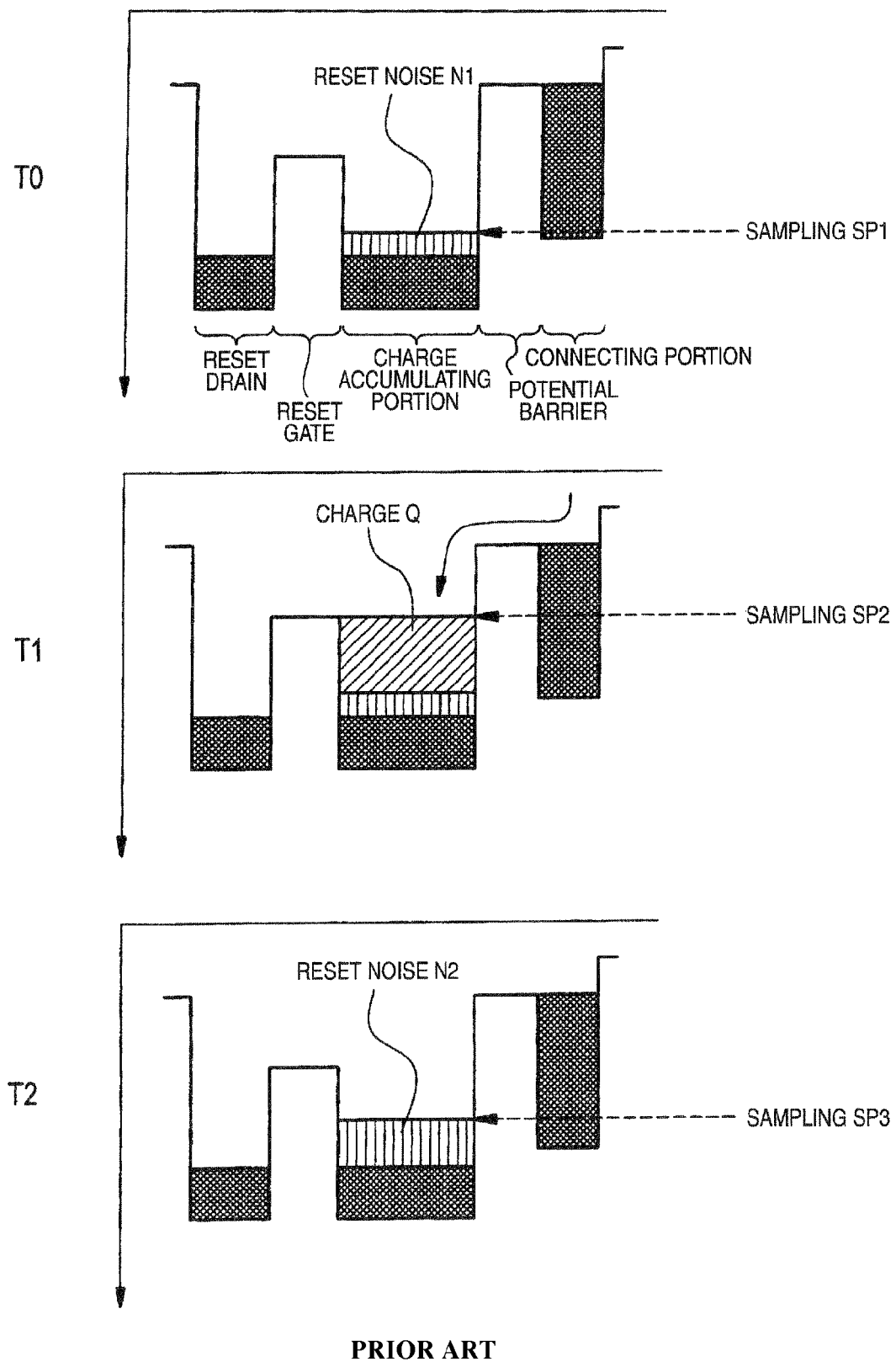
FIG. 9 is a view explaining an operation of a solid state imaging element disclosed in Patent Literature 1.
Figure 10:
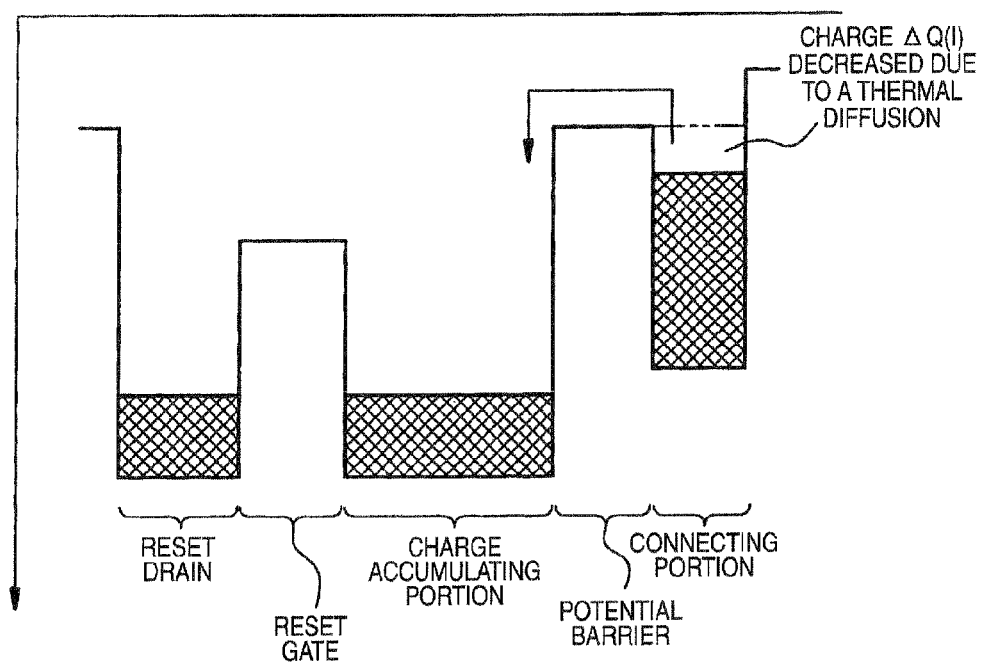
FIG. 10 is a view showing a variation of a potential of the connecting portion caused due to a thermal diffusion.

FIG. 8 is a view showing an operation of the solid state imaging element in the second embodiment in the shooting mode in respective pixels in the i-th line. FIG. 8 shows a sectional potential in the substrate 1 at respective times.

The output of the signal responding to the charges, which are generated in the photoelectric converting layer 15 in the exposure period at the preceding frame in respective pixels in the i-th line, is completed. After the reset operation of the charges accumulated in the first charge accumulating portion 4 is executed, the potential of respective pixels in the i-th line in the substrate 1 is in the initial state shown at a time T0[i].

The initial state is defined as such a state that the first voltage is applied to the barrier gate 7a of respective pixels in the i-th line such that the potential of the potential barrier portion 7 of respective pixels in the i-th line is set to the first potential that is sufficiently lower than an exposure potential being set in the exposure period, and the reset pulse is not applied to the reset gate 9 of respective pixels in the i-th line. In the initial state, the reset noise N generated by the reset operation executed before the initial state is accumulated in the first charge accumulating portion 4.

From the initial state, the driving unit 35 applies the second voltage (>first voltage) to the barrier gate 7a of respective pixels in the i-th line such that the potential of the potential barrier portion 7 becomes the exposure potential that is higher than the potential of the connecting portion 3 in the initial state, and applies the reset pulse to the reset gate 9 of respective pixels in the i-th line. Accordingly, the connecting portion 3 and the potential barrier portion 7 are set to the same potential, and the unnecessary charges existing in the connecting portion 3 and the reset noise N are discharged to the reset drain 6 (time T1[i]).

Then, the driving unit 35 stops the application of the reset pulse to the reset gate 9 of respective pixels in the i-th line. According to this, the exposure period is started, the charges G generated by the photoelectric converting layer 15 reach the connecting portion 3, and the charges G are accumulated in the first charge accumulating portion 4 via the potential barrier portion 7 (time T2[i]).

When the set exposure period reaches an end time, the driving unit 35 restores the potential of the potential barrier portion 7 to the value in the initial state by applying the first voltage to the barrier gate 7a of respective pixels in the i-th line. At this time, a large potential difference is caused between the connecting portion 3 and the potential barrier portion 7. Therefore, an inflow of the charges into the first charge accumulating portion 4 from the connecting portion 3 due to thermal diffusion is reduced to a negligibly small amount.

The driving unit 35 restores the potential of the potential barrier portion 7 to the value in the initial state, and then causes the signal output circuit to output the imaging signal (sig) that responds to the charges (Q+N) accumulated in the first charge accumulating portion 4 of respective pixels in the i-th line (time T3[$i$]). This imaging signal (sig) is sampled by the CDS circuit 31.

Then, the driving unit 35 applies the reset pulse to the reset gate 9 of respective pixels in the i-th line. The charges (Q+N) existing in the first charge accumulating portion 4 of respective pixels in the i-th line are discharged to the reset drain 6 (time T4[$i$]). Then, the driving unit 35 stops the application of the reset pulse to the reset gate 9 of respective pixels in the i-th line. Accordingly, the reset noise N' is accumulated in the first charge accumulating portion 4.

Then, the driving unit 35 causes the signal output circuit to output the reset noise (dark) responding to the reset noise N' of respective pixels in the i-th line (time T5[$i$]). This reset noise (dark) is sampled by the CDS circuit 31, and the reset noise (dark) is subtracted from (sig) obtained at a time T3[$i$] to remove the reset noise. The potentials go back to the initial state.

The driving unit 35 executes the drives from T0[$i$] to T5[$i$] while shifting the timing every line whose value of i is different.

In this manner, even in the conventional configuration shown in Patent Literature 1, the lag can be prevented by controlling variably the potential of the potential barrier portion 7, and thus the shooting of high picture quality can be achieved.

In this event, in order to aim at a higher sensitivity of the color solid state imaging element, the photoelectric converting layer 15 having the broad spectral characteristic is advantageous rather than the photoelectric converting layer that absorbs only the light in a particular wavelength range in photoelectric conversion. The reason for this is given as follows. That is, the photoelectric converting layer having the broad spectral characteristic must employ the color filter in acquiring the color image to perform the color separation, and therefore the lights except the light that can pass through the color filter are absorbed by the color filter and are not utilized in the photoelectric conversion. In contrast, the photoelectric converting layer for absorbing only the light in the particular wavelength range (e.g., green light) in photoelectric conversion can pass other lights (blue light, red light), and therefore the transmitted lights can be utilized if the devising such as the lamination of photoelectric converting layers whose absorption light is different respectively, or the like, for example, is applied, so that improvement of a light utilization efficiency is advantageous in increasing a sensitivity. Therefore, for the purpose of attaining a higher sensitivity of the imaging element, it is desirable that the photoelectric converting layer 15 explained in the first embodiment and the second embodiment should be formed of the organic material.

Also, a thickness of the photoelectric converting layer formed of the organic material is made thinner (about 300 nm) than that of the photoelectric converting layer formed of the inorganic material, and therefore a capacitance of the photoelectric converting layer is increased. That is, a capacitance accompanied with the connecting portion 3 is increased, and therefore a quantity of outflow charges ΔQ due to the thermal diffusion is also relatively increased (based on Q=CV). Therefore, the foregoing driving system shows a great advantage when the photoelectric converting layer formed of the organic material is employed.

Also, the driving method is explained by reference to a potential diagram up to now, by taking as an example the case where the signal output circuit is constructed by the n-MOS transistor circuits. But the signal output circuit may be constructed by using the p-MOS transistor circuits. In this case, the totally similar discussion can be applied except that the polarity becomes opposite to the n-MOS circuit, and therefore its explanation will be omitted herein. By the way, the signal reading circuit may be composed of the n-MOS transistors when the charge from the photoelectric converting layer 15 is the electron, and the signal reading circuit may be composed of the p-MOS transistors when the charge from the photoelectric converting layer 15 is the hole.

Also, in the above explanation, the electron is used as the handled charge. When the hole is used as the handled charge, the above potential diagrams employed in the above explanation may be viewed on the assumption that the potential is increased from the bottom to the top in the diagrams. That is, the magnitude of the potential may be read oppositely in the above explanation. Also, the n-type layers and the p-type layers may be reversed totally in the above explanation. Also, in the potential deciding mode, V_on may be reset by using Expression (3) instead of Expression (2) in step S5.

$$(V\_on)=(V\_def)-(V\_step) \times N \tag{3}$$

where N is the number of times the decision "NO" is made in step S4.

What is claimed is:

1. An imaging device, comprising:
    a solid state imaging element that has a plurality of pixels including: a semiconductor substrate; a pair of electrodes stacked above the semiconductor substrate; and a photoelectric converting layer arranged between the pair of electrodes; and
    a driving unit that drives the solid state imaging element;
    wherein each of the plurality of pixels includes:
        a connecting portion that is arranged in the semiconductor substrate and that is connected electrically to one of the pair of electrodes;
        a potential barrier portion that is arranged adjacent to the connecting portion in the semiconductor substrate and that acts as a potential barrier against a potential of the connecting portion;
        a first charge accumulating portion that is arranged adjacent to the potential barrier portion in the semiconductor substrate and in which charges generated in the photoelectric converting layer are accumulated via the connecting portion and the potential barrier portion; and
        a signal output circuit that outputs a signal in response to the charges accumulated in the first charge accumulating portion, and
    wherein the driving unit executes such a same potential driving that the connecting portion and the potential barrier portion are set to have a same potential by varying the potential of the potential barrier portion.

2. The imaging device according to claim 1, wherein the signal output circuit includes a reset transistor, and
    wherein the driving unit executes the same potential driving in such a manner that the driving unit controls the potential of the potential barrier portion so that the potential of the potential barrier portion becomes higher or lower than the potential of the connecting portion before the same potential driving is started, and unnecessary charges that overflow from the connecting portion by controlling the potential of the potential barrier portion are discharged to a drain of the reset transistor.

3. The imaging device according to claim 2, wherein the driving unit starts an exposure of the solid state imaging element in a state that the connecting portion and the potential barrier portion execute a same potential, and the driving unit decreases the potential of the potential barrier portion lower or increase the potential of the potential barrier portion higher as compared with a potential of the potential barrier portion during the exposure after the exposure is ended.

4. The imaging device according to claim 2, wherein a potential deciding mode in which the potential of the potential barrier portion in the same potential driving is decided is provided, and wherein the driving unit sets such a state that the charges responding to an incident light do not flow into the connecting portion from the photoelectric converting layer in the potential deciding mode, wherein the driving unit sets such a state that the charges responding to the incident light do not flow into the connecting portion from the photoelectric converting layer in the potential deciding mode, then repeats such a driving that the signal output circuit is caused to output a signal responding to the charges, which are accumulated in the first charge accumulating portion when the potential of the potential barrier portion is set to a value "V_on" in the state, while increasing or decreasing the value "V_on" by "V_step" every time of the driving until the signal is output from the signal output circuit of all pixels, and then sets the value "V_on" being obtained at a point of time when the signal is output from the signal output circuit of all pixels as the potential of the potential barrier portion to be executed in the same potential driving.

5. The imaging device according to claim 4, wherein the potential deciding mode is executed when a power supply is turned on.

6. The imaging device according to claim 4, wherein the potential deciding mode is executed every constant time after a power supply is turned on.

7. The imaging device according to claim 1, wherein each pixel further includes a second charge accumulating portion that is arranged in the semiconductor substrate and that is connected to a gate of an output transistor constituting the signal output circuit, and a charge transferring unit that transfers the charges accumulated in the first charge accumulating portion to the second charge accumulating portion.

8. The imaging device according to claim 7, wherein the first charge accumulating portion is formed of an embedded type accumulating portion.

9. The imaging device according to claim 1, wherein the photoelectric converting layer is formed of organic material.

10. A method of driving a solid state imaging element that has a plurality of pixels including:

a semiconductor substrate;

a pair of electrodes stacked above the semiconductor substrate;

a photoelectric converting layer arranged between the pair of electrodes;

a connecting portion that is arranged in the semiconductor substrate and that is connected electrically to one of the pair of electrodes;

a potential barrier portion that is arranged adjacent to the connecting portion in the semiconductor substrate and that acts as a potential barrier against a potential of the connecting portion;

a first charge accumulating portion that is arranged adjacent to the potential barrier portion in the semiconductor substrate and in which charges generated in the photoelectric converting layer are accumulated via the connecting portion and the potential barrier portion; and a signal output circuit that outputs a signal in response to the charges accumulated in the first charge accumulating portion, the method comprising, a same potential driving that includes variably controlling the potential of the potential barrier portion so that the connecting portion and the potential barrier portion are set to a same potential.

11. The method of driving the solid state imaging element according to claim 10, wherein the same potential driving is performed so that the potential of the potential barrier portion becomes higher or lower than the potential of the connecting portion before the same potential driving is started, and the method further comprising: discharging unnecessary charges that overflow from the connecting portion by controlling the potential of the potential barrier portion to a drain of the reset transistor in the signal output circuit.

12. The method of driving the solid state imaging element according to claim 11, further comprising:

starting an exposure of the solid state imaging element in a state that the connecting portion and the potential barrier portion are set to a same potential, and decreasing the potential of the potential barrier portion lower or increasing the potential of the potential barrier portion higher than a potential during the exposure after the exposure is ended.

13. The method of driving the solid state imaging element according to claim 11, wherein when the potential of the potential barrier portion in the same potential driving is decided, the driving of the solid state imaging element includes:

setting such a state that the charges responding to the incident light do not flow into the connecting portion from the photoelectric converting layer in the potential deciding mode;

repeating such the driving that the signal output circuit is caused to output a signal responding to the charges, which are accumulated in the first charge accumulating portion when the potential of the potential barrier portion is set to a value "V_on" in the state, while increasing or decreasing the value "V_on" by "V_step" every time of the driving until the signal is output from the signal output circuit of all pixels; and setting the value "V_on" being obtained at a point of time when the signal is output from the signal output circuit of all pixels as the potential of the potential barrier portion to be executed in the same potential driving.

14. The method of driving the solid state imaging element according to claim 13, wherein the potential of the potential barrier portion is decided when a power supply of an imaging device equipped with the solid state imaging element is turned on.

15. The method of driving the solid state imaging element according to claim 13, wherein the potential of the potential barrier portion is decided in every constant time after a power supply is turned on.

16. The method of driving the solid state imaging element according to claim 10, wherein each pixel further includes a second charge accumulating portion that is arranged in the semiconductor substrate and that is connected to a gate of an output transistor constituting the signal output circuit, and a charge transferring unit that transfers the charges accumulated in the first charge accumulating portion to the second charge accumulating portion.

17. The method of driving the solid state imaging element according to claim 16, wherein the first charge accumulating portion is formed of an embedded type accumulating portion.

18. The method of driving the solid state imaging element according to claim 10, wherein the photoelectric converting layer is formed of organic material.

* * * * *